United States Patent
Yang et al.

(10) Patent No.: US 9,347,141 B2
(45) Date of Patent: May 24, 2016

(54) NANOWIRE MESH SOLAR FUELS GENERATOR

(71) Applicant: The Regents of the University of California, Oakland, CA (US)

(72) Inventors: Peidong Yang, Kensington, CA (US); Candace Chan, El Cerrito, CA (US); Jianwei Sun, Albany, CA (US); Bin Liu, Albany, CA (US)

(73) Assignee: The Regents of the University of California, Oakland, CA (US)

( * ) Notice: Subject to any disclaimer, the term of this patent is extended or adjusted under 35 U.S.C. 154(b) by 582 days.

(21) Appl. No.: 13/658,707

(22) Filed: Oct. 23, 2012

(65) Prior Publication Data
US 2013/0105305 A1 May 2, 2013

Related U.S. Application Data

(60) Provisional application No. 61/552,279, filed on Oct. 27, 2011.

(51) Int. Cl.
| | |
|---|---|
| *C25B 1/04* | (2006.01) |
| *C25B 11/03* | (2006.01) |
| *C25B 9/00* | (2006.01) |
| *C25B 1/00* | (2006.01) |
| *C25B 3/04* | (2006.01) |
| *H01L 31/18* | (2006.01) |
| *C25B 11/02* | (2006.01) |
| *C25B 9/08* | (2006.01) |
| *B82Y 40/00* | (2011.01) |

(52) U.S. Cl.
CPC ............ *C25B 11/035* (2013.01); *C25B 1/003* (2013.01); *C25B 3/04* (2013.01); *C25B 9/00* (2013.01); *C25B 9/08* (2013.01); *C25B 11/02* (2013.01); *H01L 31/18* (2013.01); *B82Y 40/00* (2013.01); *Y02E 60/368* (2013.01)

(58) Field of Classification Search
None
See application file for complete search history.

(56) References Cited

U.S. PATENT DOCUMENTS

| | | | | |
|---|---|---|---|---|
| 5,695,890 | A * | 12/1997 | Thompson et al. ........... | 429/111 |
| 8,414,806 | B2 * | 4/2013 | Sun et al. ..................... | 264/86 |
| 2009/0020150 | A1 * | 1/2009 | Atwater ............... | H01G 9/2054 136/246 |
| 2010/0133110 | A1 * | 6/2010 | Nocera et al. ................ | 205/340 |

(Continued)

OTHER PUBLICATIONS

X. Zhang, et al, TiO2 nanowire membrane for concurrent filtration and photocatalytic oxidation of humic acid in water, Journal of Membrane Science, vol. 313, No. 1-2, Apr. 2008, pp. 44-51.*

(Continued)

*Primary Examiner* — Harry D Wilkins, III
(74) *Attorney, Agent, or Firm* — Robin C. Chiang; Lawrence Berkeley National Laboratory

(57) ABSTRACT

This disclosure provides systems, methods, and apparatus related to a nanowire mesh solar fuels generator. In one aspect, a nanowire mesh solar fuels generator includes (1) a photoanode configured to perform water oxidation and (2) a photocathode configured to perform water reduction. The photocathode is in electrical contact with the photoanode. The photoanode may include a high surface area network of photoanode nanowires. The photocathode may include a high surface area network of photocathode nanowires. In some embodiments, the nanowire mesh solar fuels generator may include an ion conductive polymer infiltrating the photoanode and the photocathode in the region where the photocathode is in electrical contact with the photoanode.

18 Claims, 7 Drawing Sheets

(56) References Cited

U.S. PATENT DOCUMENTS

| | | | | |
|---|---|---|---|---|
| 2012/0138456 A1* | 6/2012 | Spurgeon | ............... | C25B 1/003 204/252 |
| 2012/0313073 A1* | 12/2012 | McKone | ................. | C25D 3/12 257/10 |
| 2013/0092549 A1* | 4/2013 | Spurgeon | ............ | H01L 31/0586 205/340 |
| 2013/0168228 A1* | 7/2013 | Ozin et al. | ................ | 204/157.9 |

OTHER PUBLICATIONS

Hou et al, Bioinspired molecular co-catalysts bonded to a silicon photocathode for solar hydrogen evolution, Nature Materials, vol. 10, pp. 434-438, Apr. 2011.*
Warren et al, Photoelectrochemical water Splitting: Silicon Photocathodes for hydrogen evolution, Proceedings of SPIE , vol. 7770, Solar Hydrogen and Nanotechnology, Aug. 2010, pp. 77701F-1-77701F-7.*
Spurgeon et al, Electrical conductivity, ionic conductivity, optical absorption, and gas separation properties of ionically conductive polymer membranes embedded with Si microwire arrays, Energy & Environmental Science, Issue 4, Mar. 2011, pp. 1772-1780.*
Walter et al, Solar Water Splitting Cells, Chemical reviews, vol. 110, No. 11, Nov. 2010, pp. 6446-6473.*
Lei et al, Preparation and photoluminescnecne of highly ordered TiO2 nanowire arrays, Applied Physics Letters, vol. 78, No. 8, Feb. 2001, pp. 1125-1127.*
Sun J, Liu C, Yang P. "Surfactant-Free, Large-Scale, Solution—Liquid—Solid Growth of Gallium Phosphide Nanowires and Their Use for Visible-Light-Driven Hydrogen Production from Water Reduction," J. Am. Chem. Soc., 2011, 133 (48), pp. 19306-19309, Nov. 2011.
Bard, A. J.; Fox, M. A., "Artificial Photosynthesis: Solar Splitting of Water to Hydrogen and Oxygen" Acc. Chem. Res. 1995, 28, 141-145, Mar. 1995.
Walter, M. G.; Warren, E. L.; McKone, J. R.; Boettcher, S. W.; Mi, Q.; Santori, E. A.; Lewis, N. S. "Solar Water Splitting Cells" Chem. Rev. 2010, 110, 6446-6473, Nov. 2010.
Kudo, A. "Development of photocatalyst materials for water splitting," Int. J. Hydrogen Energy 2006, 31, 197-202, Feb. 2006.
Grätzel, M., "Photoelectrochemical cells" Nature 2001, 414, 338-344, Nov. 2001.
Kudo, A., "Z-scheme photocatalyst systems for water splitting under visible light irradiation" MRS Bull. 2011, 36, 32-38, Jan. 2011.
Bolton, J. R.; Strickler, S. J.; Connolly, J. S. "Limiting and realizable efficiencies of solar photolysis of water," Nature 1985, 316, 495-500, Aug. 1985.
Tomkiewicz, M.; Woodall, J. M. "Photoassisted Electrolysis of Water by Visible Irradiation of a p-Type Gallium Phosphide Electrode" Science 1977, 196, 990-991, May 1977.
Nozik, A. J. "p—n photoelectrolysis cells," Appl. Phys. Lett. 1976, 29, 150-153, Aug. 1976.
Mettee, H.; Otvos, J. W.; Calvin, M. "Solar induced water splitting with p/n heterotype photochemical diodes: n-Fe2O3/p-GaP" Sol. Energy Mater. 1981, 4, 443-453, Apr. 1981.
Trentler, T. J.; Hickman, K. M.; Goel, S. C.; Viano, A. M.; Gibbons, P. C.; Buhro, W. E. "Solution-Liquid-Solid Growth of Crystalline III-V Semiconductors: An Analogy to Vapor-Liquid-Solid Growth" Science 1995, 270, 1791-1794, Dec. 1995.
Boettcher, S. W.; Warren, E. L; Putnam, M. C.; Santori, E. A.; Turner-Evans, D.; Kelzenberg, M. D.; Walter, M. G.; McKone, J. R.; Brunschwig, B. S.; Atwater, H. A.; Lewis, N. S. "Photoelectrochemical Hydrogen Evolution Using Si Microwire Arrays" J. Am. Chem. Soc. 2011, 133, 1216-1219, Jan. 2011.
Hwang, Y. J.; Boukai, A.; Yang, P."High Density n-Si/n-TiO2 Core/Shell Nanowire Arrays with Enhanced Photoactivity" Nano Lett. 2008 9, 410-415, Dec. 2008.
Liu, M.; De Leon Snapp, N.; Park, H. "Water photolysis with a cross-linked titanium dioxide nanowire anode" Chem. Sci. 2011, 2, 80-87, Jan. 2011.

Wang, G.; Wang, H.; Ling, Y.; Tang, Y.; Yang, X.; Fitzmorris, R. C.; Wang, C.; Zhang, J. Z.; Li, Y. "Hydrogen-Treated TiO2 Nanowire Arrays for Photoelectrochemical Water Splitting" Nano Lett. 2011, 11, 3026-3033, Jun. 2011.
Jitputti, J.; Suzuki, Y.; Yoshikawa, "Synthesis of TiO2 nanowires and their photocatalytic activity for hydrogen evolution" S. Catal. Commun. 2008, 9, 1265-1271, Mar. 2008.
Yang, X.; Wolcott, A.; Wang, G.; Sobo, A.; Fitzmorris, R. C.; Qian, F.; Zhang, J. Z.; Li, Y. "Nitrogen-Doped ZnO Nanowire Arrays for Photoelectrochemical Water Splitting" Nano Lett. 2009, 9, 2331-2336, May 2009.
Chakrapani, V.; Thangala, J.; Sunkara, M. K."WO3 and W2N nanowire arrays for photoelectrochemical hydrogen production" Int. J. Hydrogen Energy 2009, 34, 9050-9059, Nov. 2009.
Su, J.; Feng, X.; Sloppy, J. D.; Guo, L; Grimes, C. A."Vertically Aligned WO3 Nanowire Arrays Grown Directly on Transparent Conducting Oxide Coated Glass: Synthesis and Photoelectrochemical Properties" Nano Lett. 2010, 11 203-208, Nov. 2010.
Hochbaum, A. I.; Yang, P. "Semiconductor Nanowires for Energy Conversion" Chem. Rev. 2009, 110, 527-546, Oct. 2009.
Yang, P.; Yan, R.; Fardy, M. "Semiconductor Nanowire: What's Next?" Nano Lett. 2010, 10, 1529-1536, Apr. 2010.
Wang, F.; Dong, A.; Sun, J.; Tang, R.; Yu, H.; Buhro, W. E. "Solution-Liquid-Solid Growth of Semiconductor Nanowires" Inorg. Chem. 2006, 45, 7511-7521, Sep. 2006.
Duan, X.; Lieber, C. M. "General Synthesis of Compound Semiconductor Nanowires"Adv. Mater. 2000, 12, 298-302, Feb. 2000.
Seo, H. W.; Bae, S. Y.; Park, J.; Yang, H.; Kim, S. "Synthesis of gallium phosphide nanowires via sublimation method" Chem. Commun. 2002, 2564-2565, Oct. 2002.
Borgstrom, M. T.; Immink, G.; Ketelaars, B.; Algra, R.; Bakkers Erik, P. A. M. "Synergetic nanowire growth" Nature Nabotech, 2007, 2, 541-544, Sep. 2007.
Lyu, S. C.; Zhang, Y.; Ruh, H.; Lee, H. J.; Lee, C. J. "Synthesis of high-purity GaP nanowires using a vapor deposition method" Chem. Phys. Lett. 2003, 367, 717-722, Jan. 2003.
Gu, Z.; Paranthaman, M. P.; Pan, Z. "Vapor-Phase Synthesis of Gallium Phosphide Nanowires" Cryst. Growth Des. 2008, 9, 525-527, Nov. 2008.
Park, J.; An, K.; Hwang, Y.; Park, J.-G.; Noh, H.-J.; Kim, J.-Y.; Park, J.-H.; Hwang, N.-M.; Hyeon, T. "Ultra-large-scale sythesis of monodisperse nanocrystals" Nature Mater. 2004, 3, 891-895, Dec. 2004.
Li, J. J.; Wang, Y. A.; Guo, W.; Keay, J. C.; Mishima, T. D.; Johnson, M. B.; Peng, X. "Large-Scale Synthesis of Nearly Monodisperse CdSe/CdS Core/Shell Nanocrystals Using Air-Stable Reagents via Successive Ion Layer Absorbtion and Reaction" J. Am. Chem. Soc. 2003, 125, 12567-12575, Sep. 2003.
Joo, J.; Kwon, S. G.; Yu, T.; Cho, M.; Lee, J.; Yoon, J.; Hyeon, T. "Large-Scale Synthesis of TiO2 Nanorods via Nonhydrolytic Sol-Gel Ester Elimination Reaction and Their Application to Photocatalytic Inactivation of E. coli" J. Phys. Chem. B 2005, 109, 15297-15302, Jul. 2005.
Yin, Y.; Alivisatos, A. P. "Colloidal nanocrystal synthesis and the organic-inorganic interface" Nature 2005, 437, 664-670, Sep. 2005.
Xiong, Y.; Xie, Y.; Li, Z.; Li, X; Gao, S. "Aqueous-Solution Growth of GaP and InP Nanowires: A General Route to Phosphide, Oxide, Sulfide, and Tungstate Nanowires" Chem. Eur. J. 2004, 10, 654-660, Feb. 2004.
Yang, Q.;Tang, K.;Li, Q.; Yin, H.;Wang, C.; Qian, Y. "The fabrication of MP (M=In and Ga) nanowires by a Ullmann reaction" Nanotechnology 2004, 15, 918-922, Jun. 2004.
Fanfair, D. D.; Korgel, B. A. "Bismuth Nanocrystal-Seeded III-V Semiconductor Nanowire Synthesis" Cryst. Growth Des. 2005, 5, 1971-1976, Aug. 2005.
Davidson, F. M.; Wiacek, R.; Korgel, B. A. "Supercritical Fluid-Liquid-Solid Synthesis of Gallium Phosphide Nanowires" Chem. Mater. 2004, 17, 230-233, Dec. 2004.
Liu, Z.; Sun, K.; Jian, W.-B.; Xu, D.; Lin, Y.-F.; Fang, J. "Soluble InP and GaP Nanowires: Self-Seeded, SolutionLiquid-Solid Synthesis and Electrical Properties" Chem. Eur. J. 2009, 15, 4546-4552, Apr. 2004.

* cited by examiner

NANOWIRE MESH SOLAR FUELS GENERATOR

RELATED APPLICATIONS

This application claims priority under 35 U.S.C. 119(e) to U.S. Provisional Patent Application No. 61/552,279, filed Oct. 27, 2011, which is herein incorporated by reference.

STATEMENT OF GOVERNMENT SUPPORT

This invention was made with government support under Contract No. DE-AC02-05CH11231 awarded by the U.S. Department of Energy. The government has certain rights in this invention.

FIELD

Embodiments disclosed herein relate to the field of solar fuels, and particularly relate to a nanowire mesh solar fuels generator.

BACKGROUND

Recently, there has been interest in converting solar energy into chemical fuels that can be stored, transported, and used when needed. This process occurs in nature through photosynthesis. In artificial photosynthesis, semiconductors are used to capture photon energy and convert it to charge carriers that can perform chemical reactions to make fuels such as hydrogen and oxygen from water, as shown in FIG. 1. Artificial photosynthesis can also be used, for example, to make methanol and oxygen from water and carbon dioxide.

SUMMARY

The systems, methods, and devices of the disclosure each have several innovative aspects, no single one of which is solely responsible for the desirable attributes disclosed herein.

Embodiments disclosed herein provide a nanowire mesh solar fuels generator. In some embodiments, the nanowire mesh solar fuels generator includes (1) a photoanode configured to perform water oxidation, where the photoanode includes a high surface area network of photoanode nanowires, and (2) a photocathode configured to perform water or carbon dioxide reduction, where the photocathode is in electrical contact with the photoanode and where the photocathode includes a high surface area network of photocathode nanowires. In some embodiments, the nanowire mesh solar fuels generator further includes an ion conductive polymer infiltrating the photoanode and the photocathode in the region where the photocathode is in electrical contact with the photoanode.

Embodiments disclosed herein also provide a method of fabricating a nanowire mesh solar fuels generator. In some embodiments, the method includes (1) fabricating a photoanode membrane of photoanode nanowires, (2) depositing a photocathode suspension of photocathode nanowires on the photoanode membrane, where the suspension includes a liquid, (3) filtering the suspension through the photoanode membrane and a filter, removing the liquid, resulting in a photocathode membrane including a high surface area network of the photocathode nanowires, and (4) drying the photoanode membrane and the photocathode membrane, resulting in the two membranes being in electrical contact with one another, forming a bi-layer structure of the nanowire mesh solar fuels generator.

In some embodiments, the method includes (1) suspending $WO_3$ nanowires in deionized water via ultrasonication, resulting in a $WO_3$ suspension, (2) first filtering the $WO_3$ suspension on a vacuum-filtration setup through at least one polyvinylidene fluoride (PVDF) filter membrane, resulting in a $WO_3$ nanowire membrane, (3) second filtering an aqueous suspension of GaP nanowires through the $WO_3$ nanowire membrane, resulting in bi-layer membrane, (4) allowing the bi-layer membrane to dry at ambient temperature, and (5) removing the dried bi-layer membrane from the filter membrane, resulting in the nanowire mesh solar fuels generator.

Embodiments disclosed herein also provide a method of fabricating a high surface area network of photocathode nanowires. In some embodiments, the method includes (1) creating the photocathode nanowires, (2) suspending the photocathode nanowires in a liquid, resulting in a photocathode suspension, (3) filtering the photocathode suspension through a filter membrane, resulting in the high surface area network of the photocathode nanowires, (4) drying the high surface area network of photocathode nanowires, and (5) removing the high surface area network of photocathode nanowires from the filter membrane.

Embodiments disclosed herein also provide a method of fabricating a high surface area network of photoanode nanowires. In some embodiments, the method includes (1) creating the photoanode nanowires, (2) suspending the photoanode nanowires in a liquid, resulting in a photoanode suspension, (3) filtering the photoanode suspension through a filter membrane, resulting in the high surface area network of the photoanode nanowires, (4) drying the high surface area network of photoanode nanowires, and (5) removing the high surface area network of photoanode nanowires from the filter membrane.

DETAILED DESCRIPTION

Figure 1:
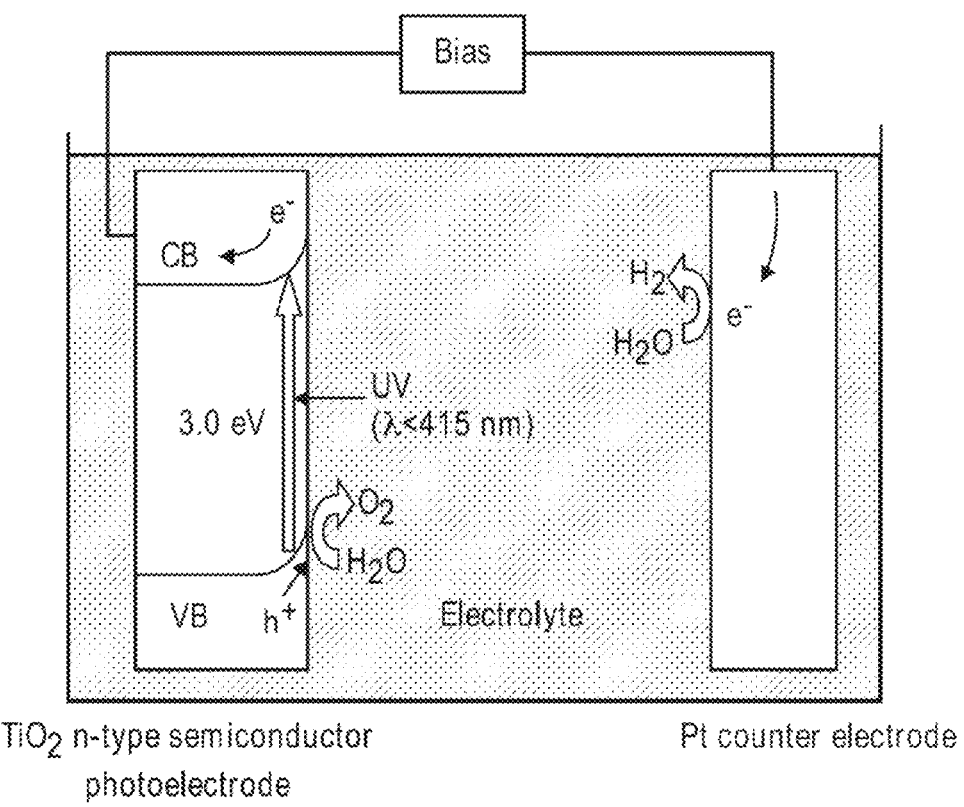
FIG. 1 shows an example of the use of a semiconductor in artificial photosynthesis.

There is interest in developing novel, nanostructured architectures for photoelectrochemical cells to carry out artificial photosynthesis. Several semiconductor catalysts that have high activity for these photocatalytic processes have been identified and studied, such as $TiO_2$, $WO_3$, $NaTaO_3$, GaP, etc. Previous work has looked at the photocurrent characteristics of films or wafers, studied suspended particles in solution, and measured the amounts of evolved gases under illumination.

Solar energy is, among various renewable energy sources, the largest energy source that would ultimately solve the terawatt energy challenge.[1] Due to its intermittency and daily and seasonal variation, solar energy needs to be captured, converted, and stored for use upon demand. Storing solar energy directly in high-energy chemical bonds, such as solar water splitting to hydrogen and oxygen, is an attractive approach.[2] A single semiconductor may be used to achieve overall solar water splitting. However, due to large overpotentials associated with the sluggish multielectron-transfer kinetics at semiconductor/electrolyte interfaces, this generally requires semiconductors having large band gaps that poorly match the solar spectrum, resulting in low efficiency.[3] This issue may be overcome by using two small band-gap semiconductors having a Z-scheme configuration, i.e., one as photocathode for hydrogen evolution and the other as photoanode for oxygen evolution, which closely mimics nature's photosynthesis.[4]

Because its conduction band edge is ~1 V more negative than both the standard water and $CO_2$ reduction potentials and its band gap is relatively small (2.27 eV at 300K), GaP a promising photocathode material for water and $CO_2$ reduction. The first use of GaP as a photocathode for visible-light-driven water reduction was reported more than three decades ago.[5] Roughly at the same time, overall solar water splitting at zero bias was demonstrated using Z-scheme photoelectrochemical (PEC) cells composed of a p-type GaP photocathode and a suitable n-type metal-oxide photoanode.[6] These early studies all used low surface-area bulk materials.

Utilization of one-dimensional semiconductor micro- and nanowires (NWs) for solar water splitting has recently attracted growing attention.[7] Compared to bulk materials, single-crystalline NWs are advantageous for solar-to-fuel conversion because the reduced radial dimension and the increased surface-to-volume ratio facilitate rapid diffusion of photogenerated charge carriers to NW surfaces, which can be decorated with high surface-area catalysts to perform the desired chemistry.[8] So far, synthesis of GaP NWs is dominated by high-temperature vapor-phase approaches,[9] which generally suffer from scalability issues. In contrast, solution-based synthesis of colloidal NWs may be readily scaled up[10] but often requires use of organic surfactants/ligands to achieve desired morphology control,[11] which necessitates additional efforts to remove the organic molecules covalently bound to nanostructure surfaces before they can be used for solar water splitting.

Further, surface-bound electrocatalysts can improve the water splitting performance of semi-conductors.[2b]

Embodiments disclosed herein provide a new architecture for photocatalysis. In some embodiments, semiconductor photocatalysts are fabricated as nanowires, which are then assembled into free-standing, paper-like mesh films. The high aspect ratio of the nanowires allows for the formation of an intertwined, porous network, similar to how cellulose fibers are assembled to form paper. The porous structure of the mesh film allows for the high surface area of the nanowires to remain accessible to the electrolyte as well as active for the photocatalytic reactions. This type of architecture could allow for easier recovery of the photocatalyst compared to suspended particles, and could also facilitate the use of photocatalysts in flow reactors.

In some embodiments, the nanowire mesh films are assembled by filtration of a suspension of nanowires onto a filter or a filter membrane. The filtration may be performed using vacuum filtration, but high pressure filtration could also be used. Once the nanowire film has dried, it could be removed from the filter membrane, resulting in a free-standing, paper-like nanowire film or membrane. One advantage of using filtration to make these films is that they can be made on a large scale, much like how paper is made industrially.

In some embodiments, multiple layers could be made if needed. For example, a nanowire mesh layer using one type of nanowire can be made as described above. A second layer consisting of another type of nanowire can then be deposited on the first nanowire layer, either using filtration or other methods such as drop casting, spin coating, or spray casting. Since the first nanowire layer has already made the mesh structure, the subsequent layers do not have to be nanowires—they can be particles, for example. Co-catalyst particles, which can lower the overpotential for the water oxidation or reduction reactions, can also be deposited in this manner. Alternatively, the co-catalyst particles can be decorated onto the nanowires first, and then the nanowires can be filtered and assembled into the mesh film afterwards.

Embodiments disclosed herein provide a two-photon, Z-scheme system to achieve overall water-splitting. In some embodiments, tungsten trioxide ($WO_3$) nanowires act as a photoanode for water oxidation, while gallium phosphide (GaP) nanowires act as a photocathode for water reduction. The $WO_3$ nanowires may be fabricated using a hydrothermal method and the GaP nanowires may be fabricated using a colloidal, solution-liquid-solid method. After synthesis, both types of nanowires are suspended separately in aqueous or water/alcohol mixtures. The two types of nanowires are assembled to form a bilayer structure by first filtering $WO_3$ nanowires and subsequently filtering the GaP nanowires onto the previous $WO_3$ nanowire layer. This type of bilayer structure could facilitate separation of the product gases. Embodiments disclosed herein have been observed to achieve overall water-splitting into hydrogen and oxygen without the use of sacrificial agents or external bias.

Embodiments disclosed herein also provide a surfactant-free, self-seeded, solution-liquid-solid (SLS)[12] approach to grow high-quality GaP NWs on a large scale. Embodiments disclosed herein allow for visible-light-driven hydrogen production from water reduction using these as-made NWs.

Apparatus

Figure 2A:
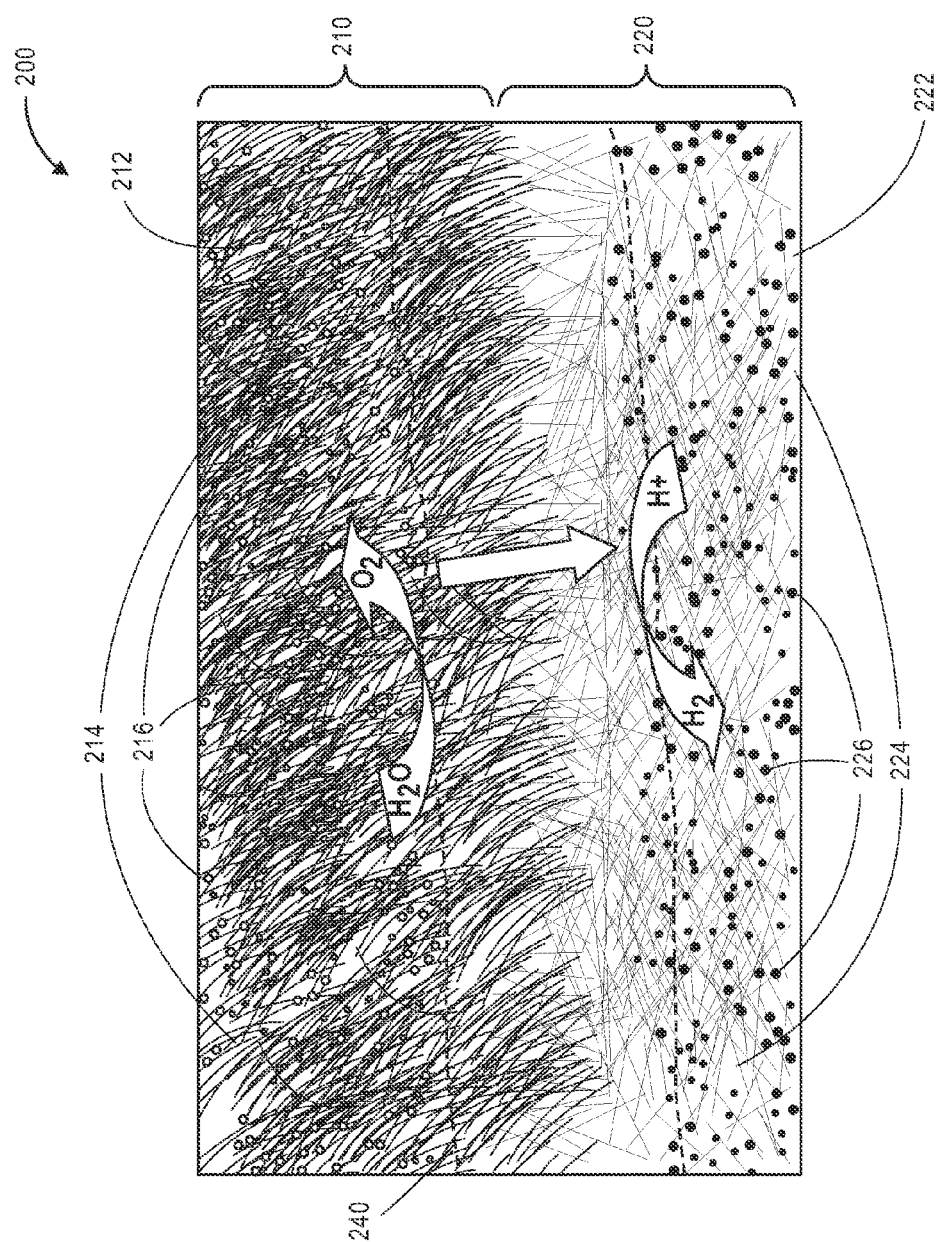
FIGS. 2A and 2B show examples of a nanowire mesh solar fuels generator.
Figure 2B:
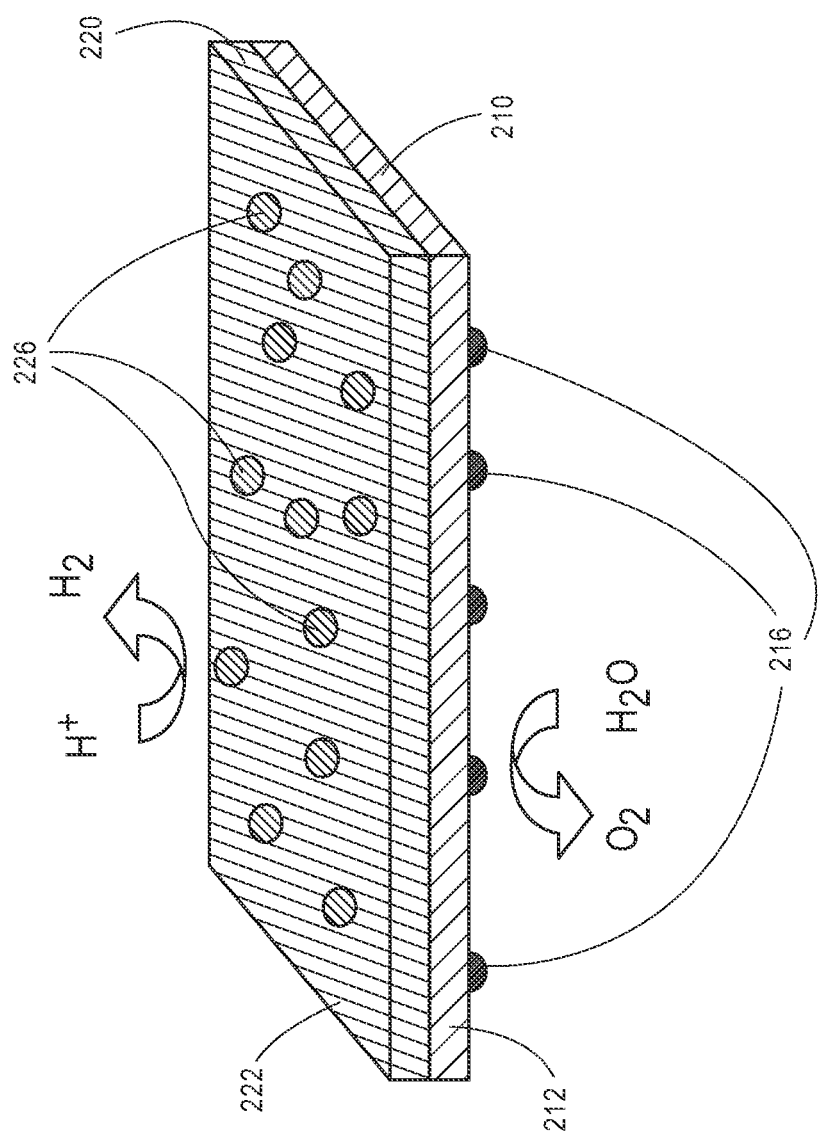

FIGS. 2A and 2B show examples of a nanowire mesh solar fuels generator. In some embodiments, a nanowire mesh solar fuels generator 200 includes a photocathode 210 and a photoanode 220. Photoanode 210 is configured to perform water oxidation and includes a high surface area network 212 of photoanode nanowires 214. Photocathode 220 includes a high surface area network 222 of photocathode nanowires 224. Photocathode 220 is configured to perform water reduction and is in electrical contact with photoanode 210. In some embodiments, the generator 200 further includes an ion conductive polymer 240 infiltrating photoanode 210 and photocathode 220 in the region where photocathode 220 is in electrical contact with photoanode 210. The half reactions associated with the water oxidation and the water reduction (i.e., solar water splitting) are set forth below:

Half reaction at photoanode: $2H_2O - 4e^- \rightarrow 4H^+ + O_2$

Half reaction at photocathode: $2H^+ + 2e^- \rightarrow H_2$

In some embodiments of a nanowire mesh solar fuels generator, a photoanode may be configured to perform water oxidation and include a high surface area network of photoanode nanowires. A photocathode may be configured to perform carbon dioxide reduction, be in electrical contact with the photoanode, and include a high surface area network of photocathode nanowires. The half reactions associated with the water oxidation and the carbon dioxide reduction (i.e., solar carbon dioxide splitting) are set forth below:

Half reaction at photoanode: $2H_2O - 4e^- \rightarrow 4H^+ + O_2$

Possible half reactions at photocathode: $CO_2 + 2H^+ + 2e^- \rightarrow HCOOH$ $CO_2 + 2H^+ + 2e^- \rightarrow CO + H_2O$ $CO_2 + 4H^+ + 4e^- \rightarrow HCOH + H_2O$ $CO_2 + 6H^+ + 6e^- \rightarrow CH_3OH + H_2O$ $CO_2 + 8H^+ + 8e^- \rightarrow CH_4 + 2H_2O$ As indicated, a number of different carbon dioxide reduction reactions may occur at the photocathode.

In some embodiments, photoanode nanowires 214 include a photoanode material selected from the group consisting of $WO_3$, $TiO_7$, $SrTiO_3$, $NaTaO_3$, oxynitrides, TaON, GaZnON, $Fe_2O_3$, and $BiVO_4$. In some embodiments, the diameter of each of photoanode nanowires 214 is about 10 nm to 500 nm. In some embodiments, the aspect ratio of each of photoanode nanowires 214 is about 10 to 1000. In some embodiments, the thickness of photoanode 210 is less than the optical absorption length of the photoanode material. For example, photoanode 210 may be about 100 nm to 100 microns thick.

In some embodiments, photoanode nanowires 214 are oriented vertically with respect to the lateral dimension of photoanode 210. Embodiments in which the photoanode nanowires 214 are oriented vertically with respect to the lateral dimension of photoanode 210 may increase or maximize the light absorption.

In some embodiments, photoanode nanowires 214 are oriented horizontally with respect to the lateral dimension of photoanode 210. Embodiments in which the photoanode nanowires 214 are oriented horizontally with respect to the lateral dimension of photoanode 210 may be inexpensive to fabricate. In some embodiments, photoanode nanowires 214 are oriented in random directions with respect to the lateral dimension of photoanode 210.

In some embodiments, network 212 includes photoanode co-catalyst particles 216 deposited on photoanode nanowires 214. In some embodiments, photoanode co-catalyst particles 216 include a photoanode co-catalyst material selected from the group consisting of Pt, cobalt oxides, manganese oxides, $RuO_x$, $IrO_x$, and water oxidation catalysts. In some embodiments, the co-catalyst particles may increase the reaction rates of reactions occurring at the photoanode.

In some embodiments, photocathode nanowires 224 include a photocathode material selected from the group consisting of GaP, Si, InGaP, InP, $Cu_2O$, and $Rh—SrTiO_3$. In some embodiments, the diameter of each of photocathode nanowires 224 is about 10 nm to 500 nm. In some embodiments, the aspect ratio of each of photocathode nanowires 224 is about 10 to 1000. In some embodiments, the thickness of photocathode 220 is less than the optical absorption length of the photocathode material. For example, photocathode 210 may be about 100 nm to 100 microns thick.

In some embodiments, photocathode nanowires 224 are oriented vertically with respect to the lateral dimension of photocathode 220. Embodiments in which the photocathode nanowires 224 are oriented vertically with respect to the lateral dimension of photocathode 220 may increase or maximize the tight absorption.

In some embodiments, photocathode nanowires 224 are oriented horizontally with respect to the lateral dimension of photocathode 220. Embodiments in which the photocathode nanowires 224 are oriented horizontally with respect to the lateral dimension of photocathode 220 may be inexpensive to fabricate. In some embodiments, photocathode nanowires 224 are oriented in random directions with respect to the lateral dimension of photocathode 220.

In some embodiments, network 222 includes photocathode co-catalyst particles 226 deposited on photocathode nanowires 224. In some embodiments, photocathode co-catalyst particles 226 include a photocathode co-catalyst material selected from the group consisting of Pt, $Mo_3S_4$, $MoS_2$, water reduction catalysts, $CO_2$ reduction catalysts, $MoS_3$, and Cu. In some embodiments, the co-catalyst particles may increase the reaction rates of reactions occurring at the photocathode.

In some embodiments, ion conductive polymer 240 includes a sulfonated tetrafluoroethylene based fluoropolymer-copolymer (e.g., Nation from DuPont, Wilmington, Del., Aciplex, Flemion). In some embodiments, the thickness of polymer 240 allows polymer 240 not to interfere with the light absorption of photoanode 210 and of photocathode 220. For example, ion conductive polymer 240 may be about 100 nm to 100 microns thick.

Methods

Figure 3A:
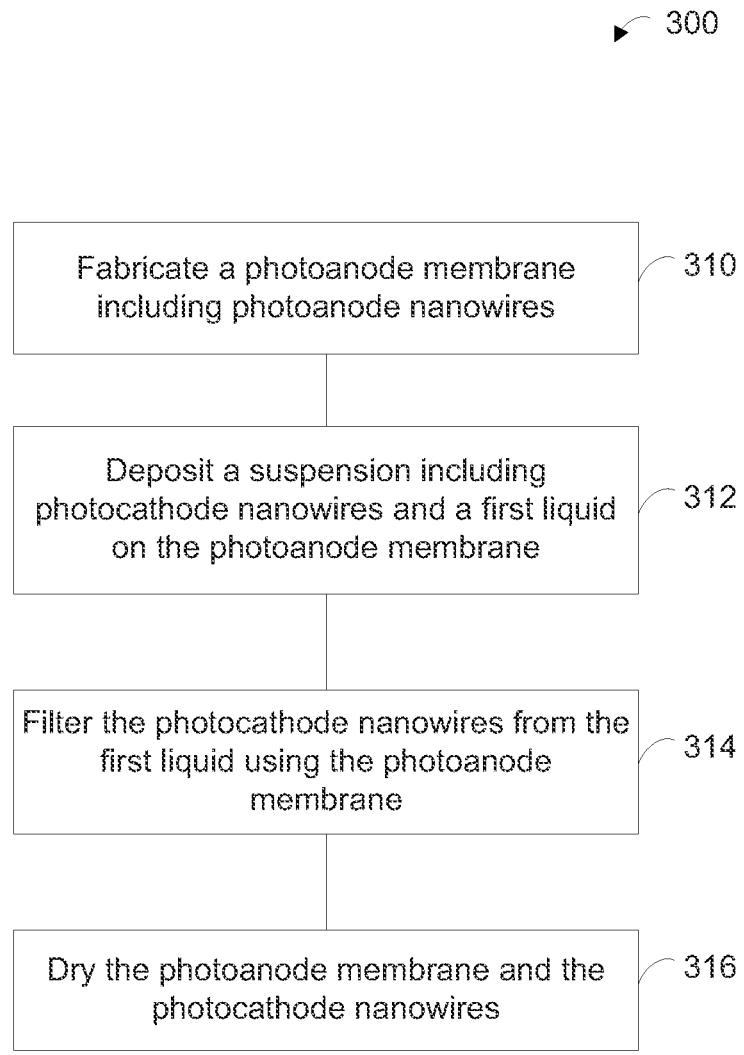
FIG. 3A shows an example of a flow diagram illustrating a process for fabricating a nanowire mesh solar fuels generator.
Figure 3B:
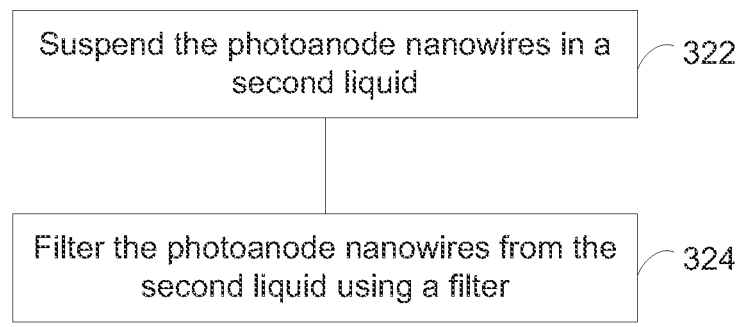
FIG. 3B shows an example of a flow diagram illustrating a process for fabricating a photoanode membrane including photoanode nanowires.
Figure 4:
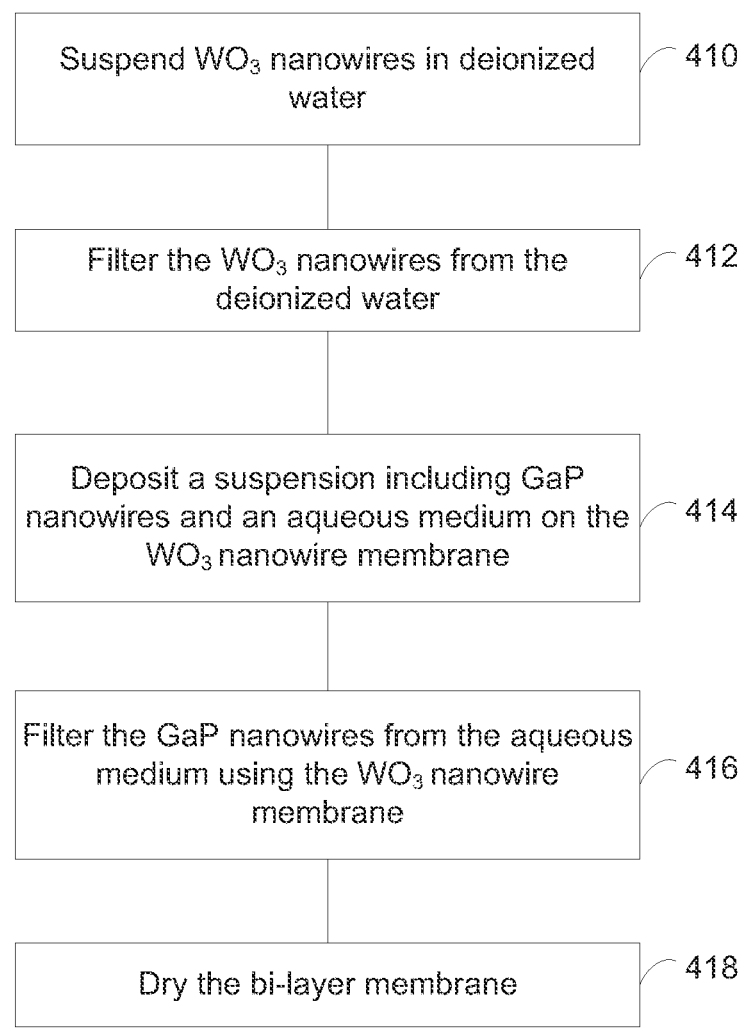
FIG. 4 shows an example of a flow diagram illustrating a process for fabricating a nanowire mesh solar fuels generator.
Figure 5:
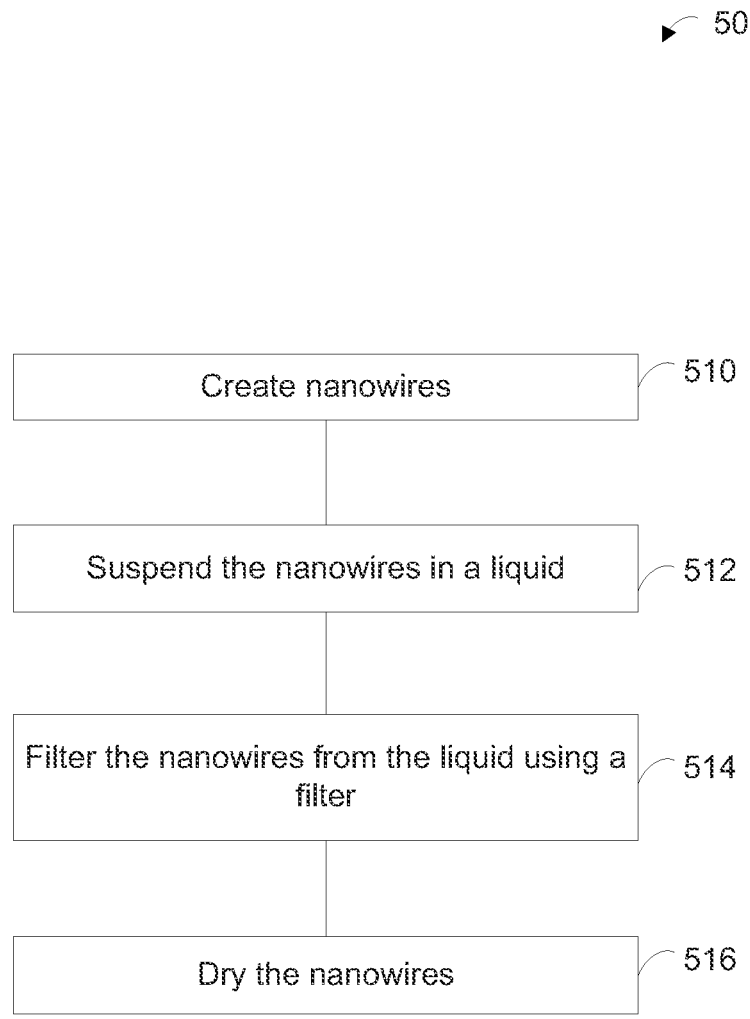
FIG. 5 shows an example of a flow diagram illustrating a process for fabricating a high surface area network of nanowires.

FIG. 3A shows an example of a flow diagram illustrating a process for fabricating a nanowire mesh solar fuels generator. FIG. 3B shows an example of a flow diagram illustrating a process for fabricating a photoanode membrane including photoanode nanowires. FIG. 4 shows an example of a flow diagram illustrating a process for fabricating a nanowire mesh solar fuels generator. The example shown in FIG. 4 lists examples of specific materials, while the example in FIGS. 3A and 3B does not list specific materials. FIG. 5 shows an example of a flow diagram illustrating a process for fabricating a high surface area network of nano-wires, which may also be referred to as a membrane.

Turning first to FIG. 3A, the process 300 includes an operation 310 of fabricating a photoanode membrane of photoanode nanowires. In operation 312, a suspension including photocathode nanowires and a first liquid is deposited on the photoanode membrane. In operation 314, the photocathode nanowires are filtered from the first liquid through the photoanode membrane. This may remove the first liquid, resulting in a photocathode membrane including a high surface area network of the photocathode nanowires. In operation 316, the photoanode membrane and the photocathode nanowires are dried, forming a bi-layer structure of the nanowire mesh solar fuels generator. In some embodiments, the photoanode membrane may be in electrical contact with the photocathode nanowires. In some embodiments, the dried bi-layer structure is removed from a filter used to fabricate the photoanode membrane, resulting in the nanowire mesh solar fuels generator.

In some embodiments, the process 300 may include forming an ion conductive polymer layer on the photoanode membrane before depositing the suspension including photocathode nanowires in operation 312. Then, the photocathode nanowires and a first liquid can be deposited on the photoanode membrane including the ion conductive polymer layer and the photocathode nanowires can be filtered from the first liquid through the polymer layer and the photoanode membrane.

In some embodiments, a process to fabricate a nanowire mesh solar fuels generator may include an operation of fabricating a photocathode membrane of photocathode nanowires and then depositing a suspension including photoanode nanowires and a first liquid on the photocathode membrane. The photoanode nanowires may be filtered from the first liquid through the photocathode membrane.

In some embodiments, as shown in FIG. 3B, the fabricating the photoanode membrane in operation 310 includes an operation 322 of suspending the photoanode nanowires in a second liquid. In operation 324, the photoanode nanowires are filtered from the second liquid using a filter, resulting in the photoanode membrane.

In some embodiments, a process for fabricating a nanowire mesh solar fuels generator may include fabricating a photoanode membrane of photoanode nanowires, described with respect to FIG. 3B. A photocathode membrane of photocathode nanowires may be fabricated in a similar manner. These membranes may be removed from any filter membrane, if present, and then one membrane may be placed on top of the other membrane to form the nanowire mesh solar fuels generator. In some embodiments, to promote contact between the membranes, the stacked membranes may be annealed while in contact with one another. In some embodiments, an ion conductive polymer layer may be placed on one membrane and the other membrane placed on top of the ion conductive polymer layer.

For example, to fabricate a nanowire mesh solar fuels generator including $BiVO_4$ nanowires and Ru/Rh—$SrTiO_3$ nanowires, $BiVO_4$ nanowires may be suspended in deionized water. The $BiVO_4$ nanowire suspension may be filtered on a vacuum-filtration setup using a potyvinylidene fluoride (PVDF) filter (e.g., 0.5 μm pore size) to form a photoanode membrane. Ru/Rh—$SrTiO_3$ nano-wires also may be suspended in deionized water and filtered on a vacuum-filtration setup using a PVDF filter to form a photocathode membrane. After filtration, the nanowires may be allowed to dry in ambient air. Once dry, each of the membranes including nanowires may be detached from the filters. The membranes may be stacked, one on the other, to form the nanowire mesh solar fuels generator. To promote good physical contact between Ru/Rh—$SrTiO_3$ and $BiVO_4$ nanowires, the membranes may be stacked on one another and annealed at about 500° C. to 800° C. in an inert atmosphere, such as argon.

FIG. 4 shows an example of a flow diagram illustrating a process for fabricating a nanowire mesh solar fuels generator. The process 400 includes an operation 410 of suspending $WO_3$ nanowires in deionized water. In some embodiments, the $WO_3$ nanowires are suspended via ultrasonication operation 412, the $WO_3$ nanowires are filtered from the deionized water, resulting in a $WO_3$ nanowire membrane. In some embodiments, the $WO_3$ nanowires are filtered on a vacuum-filtration setup through at least one polyvinylidene fluoride (PVDF) filter. In operation 414, an aqueous suspension of GaP nanowires is deposited on the $WO_3$ nanowire membrane. In operation 416, the GaP nanowires are filtered from the aqueous medium using the $WO_3$ nanowire membrane. This may result in a bi-layer membrane. In operation 418, the bi-layer membrane is dried. In some embodiments, the hi-layer membrane is dried at ambient temperature. In some embodiments, the dried bi-layer membrane is removed from the filter, resulting in the nanowire mesh solar fuels generator.

In some embodiments, the process 400 may include depositing a co-catalyst on the $WO_3$ nanowires. For example, in some embodiments, the co-catalyst may be a Pt co-catalyst. The Pt co-catalyst may be deposited on the $WO_3$ nanowires using an impregnation process with an aqueous solution of $H_2PtCl_6$, for example. In some embodiments, the Pt co-catalyst may be deposited at about 0.25 weight percent (wt %) to 0.75 wt %, or about 0.5 wt %. In some embodiments, the $WO_3$ nanowires and the co-catalyst may be annealed in air at about 250° C. to 350° C., or about 300° C., for about 0.5 hours to 1.5 hours, or about 1 hour. In some embodiments, annealing the nanowires and the co-catalyst particles may increase the contact between the two, improving the effect of the co-catalyst particles.

In some embodiments, the co-catalyst may be a $RuO_2$ co-catalyst. The $RuO_2$ co-catalyst may be deposited on the $WO_3$ nanowires using an impregnation process with an aqueous solution of $RuCl_3$, for example. In some embodiments, the $RuO_2$ co-catalyst may be deposited at about 0.25 wt % to 0.75 wt %, or about 0.5 wt %. In some embodiments, the $WO_3$ nanowires and the co-catalyst may be annealed in air at about 250° C. to 350° C., or about 300° C. for about 0.5 hours to 1.5 hours, or about 1 hour.

In some embodiments, the process 400 may include depositing a co-catalyst on the GaP nanowires. For example, in some embodiments, the co-catalyst may be a Pt co-catalyst. The Pt co-catalyst may be deposited on the GaP nanowires using an impregnation process with an aqueous solution of $H_2PtCl_6$, for example. In some embodiments, the Pt co-catalyst may be deposited at about 0.25 wt % to 0.75 wt %, or about 0.5 wt %. In some embodiments, the GaP nanowires and the co-catalyst may be annealed in air at about 250° C. to 350° C., or about 300° C., for about 0.5 hours to 1.5 hours, or about 1 hour.

FIG. 5 shows an example of a flow diagram illustrating a process for fabricating a high surface area network of nanowires, also referred to as a membrane of nanowires. The process 500 includes an operation 510 of creating the nanowires. In operation 512, the nanowires are suspended in a liquid. In some embodiments, the nanowires may be suspended in a liquid using ultrasonication. In some embodiments, the liquid may be water, deionized water, ethanol, methanol, another alcohol, or an alcohol/water mixture in operation 514, the nanowires are filtered from the liquid using a filter, resulting in a high surface area network of the nanowires or a membrane. In operation 516, the high surface area network of nanowires is dried. In some embodiments, the high surface area network of nanowires is dried at ambient temperature. In some embodiments, the high surface area network of nanowires is then removed from the filter.

In some embodiments, the nanowires may include photocathode GaP nanowires. In some embodiments, creating GaP nanowires in operation 510 is performed using a solution-liquid-solid (SLS) synthesis technique. For example, the solution-liquid-solid (SLS) synthesis technique may include adding triethylgallium and tris(trimethylsilyl)phosphine to squalane at about 300° C., allowing an in-situ thermal decomposition of the triethylgallium to occur, resulting in Ga droplets. The Ga droplets serve as catalyst particles for the SLS synthesis of the GaP nanowires.

After creating the GaP nanowires, the nanowires may be washed. In some embodiments, washing the nanowires includes washing the GaP nanowires with ethanol. Ga impurities then may be eliminated from the washed GaP nanowires. In some embodiments, eliminating the Ga impurities includes eliminating the Ga catalysts with HCl.

In some embodiments, the nanowires may include photocathode Rh—$SrTiO_3$ nanowires. In some embodiments, creating Rh—$SrTiO_3$ nanowires in operation 510 is performed with a hydrothermal synthesis technique combined with a solvothermal ion-exchange reaction. For example, the hydrothermal synthesis technique may include mixing about 6 g of anatase nanopowder (average size about 25 nm to 70 nm) with about 50 mL of NaOH aqueous solution (about 15 M) at room temperature. The mixture may be heated in a Teflon-lined autoclave (e.g., about 125 mL) at about 180° C. for about 3 days.

After the hydrothermal synthesis, the precipitates may be collected and washed extensively with about 0.6 M HCl aqueous solution and water to exchange $Na^+$ with $H^+$ for the synthesis of $H_2Ti_3O_7$ nanowires. Rh—$SrTiO_3$ nanowires may be fabricated from a solvothermal ion-exchange reaction using $H_2Ti_3O_7$ nanowires as the templates. Calculated amounts of $H_2Ti_3O_7$ nanowires may be dispersed in about 40 mL of $Sr(OH)_2$ aqueous-ethanol solution ($V_{ethanol}$:$V_{water}$=about 4:1). The molar ratio of strontium to titanium may be fixed at about 1.5. Following this, about 1 mole percent (Rh/Ti=1/99) of $Rh(NO_3)_3$ may be added into the suspension and the mixture may be autoclaved in a Teflon-lined autoclave (e.g., about 45 at about 120° C. for about 2 days. After completion of the reaction, the harvested precipitates may be washed repeatedly with about 0.1 M formic acid to remove residue $SrCO_3$ and water, and dried in ambient air. The final product may be calcined at about 800° C. for about 4 hours.

In some embodiments, Ru co-catalysts (e.g., about 1 wt %) may be loaded onto the Rh—$SrTiO_3$ nanowires by photo-deposition from an aqueous-methanol solution (10 volume % methanol) containing a calculated amount of $RuCl_3.nH_2O$ to function as active sites for hydrogen evolution. Ru-loaded Rh—$SrTiO_3$ nanowires may be harvested by filtration and washed with deionized water and dried in ambient air.

In some embodiments, the nanowires may include photo-anode $WO_3$ nanowires. In some embodiments, creating $WO_3$ nanowires in operation 510 is performed with a hydrothermal synthesis technique. For example, the hydrothermal synthesis technique may include dissolving about 1 g $Na_2WO_4$ in about 30 mL deionized water, resulting in dissolved $Na_2WO_4$. Adding about 3 M HCl to the dissolved $Na_2WO_4$, resulting in a total volume of about 50 mL, may precipitate yellow tungstenic acid from the dissolved $Na_2WO_4$, resulting in a first fabricating, suspension. The first fabricating suspension may be centrifuged at about 1200 rpm for about 5 minutes, resulting in a supernatant. The supernatant may be decanted, and then about 40 g of $K_2SO_4$ and about 25 mL of deionized water may be added to the decanted supernatant, resulting in a second fabricating suspension. The second fabricating suspension may be heated in an about 45 mL volume Teflon-lined autoclave for about 12 to 15 hours at about 180° C., resulting in heated $WO_3$ nanowires. The $WO_3$ nano-wires may be allowed to cool to room temperature.

The $WO_3$ nanowires may then be filtered from solution. After filtering the $WO_3$ nanowires, the nanowires may be washed. For example, the $WO_3$ nanowires may be washed with deionized water, removing residual $K_2SO_4$.

In some embodiments, the nanowires may include photo-anode $BiVO_4$ nanowires. About 1 mmol of $V_2O_5$ powder and about 2 mmol of $Na_2SO_4$ may be mixed in about 30 mL of deionized water at room temperature. This mixture may be heated in a Teflon-lined autoclave (e.g., about 45 mL) at about 180° C. for about 24 hours for the synthesis of $Na_2V_6O_{16}.3H_2O$ nanowire templates. Following this, a calculated amount of $Na_2V_6O_{16}.3H_2O$ nano-wires may be mixed with $Bi(NO_3)_3.5H_2O$ (e.g., Bi/V=1) in about 40 ml of an ethanol-water solution (e.g., $V_{ethanol}$:$V_{water}$=about 4:1). The mixture may be autoclaved in a Teflon-lined autoclave (e.g., about 45 mL) at about 120° C. for about 24 hours to convert the $Na_2V_6O_{16}.3H_2O$ nanowires into monoclinic $BiVO_4$ nanowires.

The nanowire fabrication methods described above may be scaled to produce greater amounts of nanowires, as needed.

EXPERIMENTAL/EXAMPLES

The following experimental details/examples are offered for illustrative purposes, and are intended neither to limit nor define the embodiments disclosed herein in any manner.

$WO_3$ nanowires were fabricated using hydrothermal treatment of tungstenic acid with potassium sulfate as a structure directing agent. Briefly, about 1 g $Na_2WO_4$ was dissolved in about 30 mL deionized water. About 3M HCl was added to a total volume of about 50 mL to precipitate the yellow tungstenic acid. The suspension was centrifuged at about 1200 rpm for about 5 minutes. The supernatant was decanted and about 40 g of $K_2SO_4$ and about 25 mL of deionized water were added. The suspension was transferred to a 45 mL volume Teflon-lined autoclave and heated for about 12 to 15 hours at about 180° C., then cooled to room temperature naturally. Afterwards, the $WO_3$ nanowires were filtered from the solution and repeatedly washed with deionized water to remove the residual $K_2SO_4$.

GaP nanowires were fabricated using a self-seeded solution-liquid-solid method. Briefly, triethylgallium and tris(trimethylsilyl)phosphine were added to squalane at about 300° C. Gallium metal droplets formed due to an in-situ thermal decomposition of the triethylgallium. These Ga droplets served as catalyst particles for the solution-liquid-solid synthesis of GaP nanowires. After the synthesis, the nanowires were washed with ethanol and the Ga catalyst was removed with HCl.

The GaP NWs were grown by a surfactant-free, self-seeded, sol id (SLS) method in squalane. The SLS syntheses of GaP NWs used triethylgallium (TEG) and tris(trimethylsilyl)phosphine (TMSP) as precursors. In addition, saturated hydrocarbons having high boiling points as non-coordinating solvents may be used to fabricate straight GaP NWs. Squalane was empirically found to be a good solvent. The wire growth in squalane was found to be a self-seeded SLS process: the precursor first thermally decomposes in situ to generate Ga nanoscale droplets, which then subsequently promote the growth of GaP NWs via the SLS mechanism In the absence of surface ligands, small Ga nanodroplets tended to grow rapidly and aggregate, resulting in highly tapered wires. To achieve better control over the wire growth, synthetic conditions including the precursor ratio, concentration, and stirring were adjusted. In a typical synthesis process, the Ga and P precursors (molar ratio of about 1:1) were injected into hot squalane solvent at about 290° C. The mixture was vigorously stirred for about 30 seconds to form a homogeneous solution. After stirring was stopped, the color of the solution changed to yellow in about 15 to 20 seconds due to the generation of Ga nanodroplets and then quickly to dark brown as the NWs grew. Although the initial precursor ratio was about 1:1, the P precursor was in slight excess during wire growth because a portion of the Ga precursor was first consumed to generate Ga nanoparticles. The product yield reached ~80% under ideal conditions.

To remove the viscous squalane solvent and any unreacted precursors and by-products, the as-fabricated GaP NWs were washed with toluene, methanol, and DI water in sequence. The purified wires could be readily dispersed in aqueous solutions. Next, the Ga nanoparticles (NPs) attached to NW tips were effectively removed without damage to the wires. Since Ga reacts with hydrochloric acid (2Ga+6HCl→$2GaCl_3+3H_2$) while GaP does not,[13] the purified GaP NWs were then dispersed in about 1 M HCl with stirring. Bubbles were observed due to formation of hydrogen gas. TEM images taken after the HCl treatment showed that all Ga NPs were completely etched away and no diameter change of the NWs was noticed.

Further experimental details regarding the chemicals used in the experimental processes and the experimental processes are given below. Triethylgallium (TEG, min. 97%), tris(trimethylsilyl)phosphine (TMSP, min. 98%), squalane (99%), trin-octylphosphine oxide (TOPO, 99%), toluene (99.9%), methanol (99.9%), hydrochloric acid (1 M volumetric solution), were used for the syntheses and purification of GaP nanowires. Water (ultrapure, spectrophotometric grade) and methanol (≥99.9%, spectrophotometric grade,) were used for the photocatalytic water reduction measurements using gas chromatography.

Squalane was degassed and dried at ~140° C. under vacuum for ~2 h and stored in a glove box filled with dry $N_2$. The precursor TEG-TMSP solution was prepared in the glove box by mixing TEG (2.354 g, 15 mmol) with TMSP 0.758 g, 15 mmol), followed by adding squalane (93.888 g). When TEG was mixed with TMSP, white precipitate was observed immediately, indicating that a TEG-TMSP adduct was formed. Under continuous stirring of the mixture, the white precipitate dissolved in squalane to form a clear solution, which was stored in the glove box for use.

All procedures were conducted under dry $N_2$ using standard Schlenk technique. In a typical preparation, squalane (150 mL) was loaded into a reaction flask, degassed, and dried at ~100° C. under vacuum. After back-filled with dry $N_2$, the flask was inserted into a preheated salt bath (NaNO3/KNO3, 46/54 by weight) at about 290° C. The reaction mixture was allowed to equilibrate to the salt bath temperature for at least about 30 min. Then the TEG-TMSP stock solution (about 5 g) was transferred into a syringe and quickly injected into the flask under vigorous stirring (about 800 rpm). After about 30 s, stirring was stopped and the color of the reaction mixture changed to yellow at about 45 s to 50 s, indicating formation of Ga nanoparticles, and then quickly to brown as the nanowires grew. The reaction flask was withdrawn from the salt bath about 15 min after the precursor injection and allowed to cool.

The GaP nanowires were separated from the reaction mixture by centrifugation (about 6000 rpm). The precipitated wires were redispersed in toluene (~100 mL), sonicated for a few minutes, and recollected by centrifugation (about 6000 rpm). This operation was repeated about 5 times to remove unreacted precursors, by-products, and squalane. The recollected wires were redispersed in toluene (~200 mL) and filtered through a PVDF filter membrane (pore size 0.22 µm), followed by washing with methanol (~250 mL) and DI water (~250 mL) and drying under ambient conditions.

The purified GaP nanowires having Ga nanoparticle tips were dispersed in about 1 M hydrochloric acid (~25 mL). The mixture was stirred for 5 h with occasional sonication. During this process, bubbles were observed due to hydrogen generation by the reaction between Ga nanoparticles and hydrochloric acid. With time, the wires aggregated and precipitated. After about 5 h, the precipitate was collected by centrifugation (about 2000 rpm). The collected wires were dispersed in DI water (~25 mL), sonicated for a few minutes, and recollected by centrifugation (about 2000 rpm). This operation was repeated a few times until the wires could be well dispersed in DI water. Then the recollected wires were redispersed in DI water (~200 mL). Any wires that floated on the water surface were removed. The aqueous dispersion of GaP nanowires was then filtered through PVDF filter membrane (pore size 0.22 µm), followed by washing with DI water (~1 L) and drying under ambient conditions.

Pt or $RuO_2$ co-catalyst was deposited on the $WO_3$ nanowires at 0.5 wt % using impregnation from aqueous solutions of $H_2PtCl_6$ or $RuCl_3$ followed by annealing in air at about 300° C. for about 1 hour. GaP nanowires were decorated with Pt co-catalyst in a similar fashion.

Small Pt nanoparticles (NPs) also were photochemically deposited onto the GaP NW surfaces using $H_2PtCl_6$ precursor dissolved in a methanol-water solution.

The nanowire mesh films were assembled by filtration of a suspension of nanowires onto a filter membrane. $WO_3$ nanowire meshes were fabricated by suspending the $WO_3$ nanowires in deionized water using ultrasonication. The suspensions were filtered on a vacuum-filtration setup using PVDF filter membranes (Durapore, 0.2 µm pore size). After filtration, the films were allowed to dry at ambient temperature. Once dried, the $WO_3$ films could be removed from the filter membranes as free standing meshes.

The surfactant-free synthesis of GaP NWs can be easily scaled up. To demonstrate this, ~75 mg of purified, Ga-removed wires were prepared using about 300 mL of squatane according to the general procedure described above. A large NW membrane was then made by filtration of an aqueous NW suspension through a commercial PVDF filter membrane.

To utilize the Z-scheme using the GaP and $WO_3$ NWs, a bilayer NW mesh was fabricated. After the synthesis, both types of nanowires were suspended separately. Good solvents were water for the $WO_3$ NWs and ethanol for the GaP NWs. The two types of nanowires were assembled to form a bilayer structure by first filtering $WO_3$ nanowires and subsequently filtering the GaP nanowires onto the previously formed $WO_3$ nanowire layer. Since the first nanowire layer has already made the mesh structure, the subsequent layers do not have to be nanowires they can be particles). However, using the GaP in nanowire form facilitated the formation of good networks within each semiconductor mesh layer. Afterwards, the bilayer was annealed at about 500° C. for about 1 hour to promote good contact at the interface between the $WO_3$ and GaP. Then $RuO_2$ particles were deposited on the $WO_3$ side as the water oxidation co-catalyst.

The characterization and performance of the nanowire structures are given below. Powder X-ray diffraction (XRD) patterns were recorded with a diffractometer using Co Kα radiation ($\lambda$=1.790 Å). The $WO_3$ and GaP nanowires were examined with a field emission scanning electron microscope with an operating voltage of 5 kV and transmission electron microscope with acceleration voltage of 120 kV. UV-vis absorption spectra were taken using an instrument equipped with an integrating sphere.

The photocatalytic activity of the nanowires was evaluated using inline gas chromatography (Ar carrier). Water oxidation using $WO_3$ nanowire photocatalyst was performed in a side-window cell made of quartz connected to a gas-closed circulation system. Irradiation was performed using a 450 W Xe tamp or a 500 W Hg(Xe) lamp with a water filter to remove IR light. The $WO_3$ nanowire powder was suspended in a pH 1 solution of 2 mM $FeCl_3$ at a concentration of 10 mg/4 ml, electrolyte. The solution was evacuated to remove dissolved air and purged with Ar prior to irradiation. The evolved. $O_2$ was detected using inline gas chromatography (GC), with measurements recorded every 1 to 2 hours. The GaP nanowires were suspended in an electrolyte solution of 10 vol % methanol in water at a concentration of 2 mg/4 mL electrolyte and evaluated for $H_2$ evolution.

Photocurrent measurements were obtained by coating slurries of the $WO_3$ nanowires onto fluorine-doped tin oxide (PTO) coated glass by doctor blading. The slurry consisted of $WO_3$ nanowires, acetylacetone, and a nonionic surfactant having a hydrophilic polyethylene oxide chain and an aromatic hydrocarbon lipophilic or hydrophobic group (e.g., Triton X-100, Dow Chemical Company, Midland, Mich.) or mixed with $Na_2WO_4$. After coating, the samples were annealed at 550° C. for 1 hour in air. The photocurrent data was taken using irradiation from a 300 W Xe lamp at 100 mW/cm$^2$. Illuminated open circuit potential measurements were also performed. For all measurements, a Pt mesh was used as the counter electrode and a Ag/AgCl electrode was used as the reference electrode.

The yield of $WO_3$ nanowires from each 45 mL autoclave reactor was approximately 800 mg per reactor. The $WO_3$ nanowires had a diameter of approximately 10 nm and lengths of 10 μm to 20 μm. The $WO_3$ nanowires had a tendency to form bundles of multiple nanowires, according to SEM observations and TEM observations.

Representative low- and high-magnification TEM images of the as-fabricated GaP NWs showed that the wires were relatively uniform, having length of about 1 μm to 2 μm and diameter of about 30 nm. Detailed TEM study showed that the wires were slightly tapered at the nanoparticle-free end, indicating that the initially generated Ga nanoparticles grew during the wire growth until a steady state was achieved. The single-crystalline nature of the NWs was clearly seen in a lattice-resolved high-resolution TEM (HRTEM) image. The fast-Fourier-transform (FFT) pattern of the image was indexed to the zinc-blende structure and indicated a [111] wire growth direction. The spacing of the lattice fringes perpendicular to the growth direction was measured to be 0.316 nm, consistent with the d spacing of (111) planes in zinc-blende GaP (Joint Committee on Powder Diffraction Standards (JCPDS) 12-0191). The zinc-blende structure of the GaP NWs was also confirmed by powder X-ray diffraction.

The size of the deposited Pt NPs was found to be related to the Pt loading amount (determined from the initial $H_2PtCl_6$/NW ratio) at fixed illumination conditions. Higher Pt loading amount yielded relatively larger Pt NPs. HRTEM of GaP NWs with 5 wt % Pt loading showed 1 nm to 2 nm NPs anchored on the surface of a single wire. The spacing of the lattice fringes in a lattice-resolved NP was measured to be 0.22 nm, consistent with the d spacing of (111) planes in cubic Pt. When the Pt loading amount was reduced to 2 wt %, the deposited NPs could not be clearly imaged by TEM. However, Pt signals were detected by X-ray photoelectron spectroscopy, suggesting that extremely small Pt clusters (<1 nm) were deposited at low Pt loading. GC measurements were also conducted using these Pt-loaded GaP NWs at the same conditions used for the as-made GaP NWs described above. The hydrogen production rate was significantly enhanced (up to ~40 nmol/h) using Pt-loaded GaP NWs at low Pt loading of 2 wt %.

The final structure was a free-standing membrane made entirely of nanowires. One side was the photoanode, and the other was the photocathode. Both sides were irradiated for the two-photon, Z-scheme configuration to be realized as first demonstrated with n- and p-type semiconductor wafers bonded together. This type of bilayer structure can facilitate separation of the product gases and also allow for ionic transport through the mesh without needing a polymer layer such as Nafion in between the two layers. Unlike bonded wafers, ionic transport can occur through the membrane due to its porous nature. With this design, the bilayer NW mesh can be submerged in water and spontaneously split water under illumination.

The nanowire bilayer mesh was tested for overall water splitting by immersing it in deionized water and irradiating it with a 500 W Hg(Xe) lamp. In the first run, only $H_2$ was observed. After evacuating the cell, refilling with Ar, and restarting the irradiation, $O_2$ was observed. The $H_2$ to $O_2$ ratio was about 5:1 for the second run. The amount of $O_2$ increased with each run such that the ratio became 4.4:1 for run 3, 3:1 for run 4, and 2.45:1 for run 5. The amount of $N_2$ detected in the gas chromatogram was negligible, indicating that the $O_2$ likely came from water oxidation and not from an air leak.

Further details regarding the apparatus, methods, experiment, and examples described above can be found in Jianwei Sun, Chong Liu, and Peidong Yang, "Surfactant-Free, Large-Scale, Solution-Liquid-Solid Growth of Gallium Phosphide Nanowires and Their Use for Visible-Light-Driven Hydrogen Production from Water Reduction," J. Am. Chem. Soc., 2011, 133 (48), pp. 19306-19309, which is herein incorporated by reference.

REFERENCES

1. Lewis, N. S.; Nocera, D. G. Proc. Natl. Acad. Sci. U.S.A. 2006, 103, 15729-15735.
2. (a) Bard, A. J.; Fox, M. A. Ace. Chem. Res. 1995, 28, 141-145. (b) Walter, M. G.; Warren, E. L.; McKone, J. R.; Boettcher, S. W.; Mi, Q.; Santori, E. A.; Lewis, N. S. Chem. Rev. 2010, 110, 6446-6473.
3. Kudo, A. Int. J. Hydrogen Energy 2006, 31, 197-202.
4. (a) Grätzel, M. Nature 2001, 414, 338-344. (b) Kudo, A. MRS Bull. 2011, 36, 32-38. (c) Bolton, J. R.; Strickler, S. J.; Connolly, J. S. Nature 1985, 316, 495-500.
5. Tomkiewicz, M.; Woodall, J. M. Science 1977, 196, 990-991.
6. (a) Nozik, A. J. Appl. Phys. Lett. 1976, 29, 150-153, (b) Mettee, H.; Otvos, J. W.; Calvin, M. Sol. Energy Mater. 1981, 4, 443-453.
7. (a) Boettcher, S. W.; Warren, E. L.; Putnam, M. C.; Santori, E. A.; Turner-Evans, D.; Kelzenberg, M. D.; Walter, M. G.; McKone, J. R.; Brunschwig, B. S.; Atwater, H. A.; Lewis, N. S. J. Am. Chem. Soc. 2011, 133, 1216-1219. (b) Hwang, Y. J.; Boukai, A.; Yang, P. Nano Lett. 2008, 9, 410-415. (c) Liu, M.; de Leon Snapp, N.; Park, H. Chem. Sci. 2011, 2, 80-87. (d) Wang, G.; Wang, H.; Ling, Y.; Tang, Y.; Yang, X.; Fitzmorris, R. C.; Wang, C.; Zhang, J. Z.; Li, Y. Nano Lett. 2011, 11, 3026-3033. (e) Jitputti, J.; Suzuki, Y.; Yoshikawa, S. Catal. Commun. 2008, 9, 1265-1271. (f) Yang, X.; Wolcott, A.; Wang, G.; Soho, A.; Fitzmorris, Z. C.; Qian, F.; Zhang, J. Z.; Li, Y. Nano Lett. 2009, 9, 2331-2336. (g) Chakrapani, V.; Thangala, J.; Sunkara, M. K. Int. J. Hydrogen Energy 2009, 34, 9050-9059. (h) Su, J.; Feng, X.; Sloppy, J. D.; Guo, L.; Grimes, C. A. Nano Lett, 2010, 11, 203-208.
8. (a) Hochbaum, A. I.; Yang, P. Chem. Rev. 2009, 110, 527-546. (b) Yang, P.; Yan, R.; Fardy, M. Nano Lett. 2010, 10, 1529-1536.
9. (a) Duan, X.; Lieber, C. M. Adv. Mater. 2000, 12, 298-302. Seo, H. W.; Bae, S. Y.; Park, J.; Yang, H.; Kim, S. Chem. Commun. 2002, 2564-2565. (c) Borgstrom, M. T.; Immink, G.; Ketelaars, B.; Algra, R.; BakkersErik, P. A. M. Nature Nanotech. 2007, 2, 541-544. (d) Lyu, S. C.; Zhang, Y.; Ruh, H.; Lee, H. J.; Lee, C. J. Chem. Phys. Lett. 2003, 367, 717-722. (e) Gu, Z.; Paranthaman, M. P.; Pan, Z. Cryst. Growth Des. 2008, 9, 525-527.
10. (a) Park, J.; An, K.; Hwang, Y.; Park, J.-G.; Noh, H.-J.; Kim, J.-Y.; Park, J.-H.; Hwang, N,-M.; Hyeon, T. Nature Mater. 2004, 3, 891-895. (b) Li, J. J.; Wang, Y. A.; Guo, W.; Keay, J. C.; Mishima, T. D.; Johnson, M. B.; Peng, X. J. Am. Chem. Soc. 2003, 125, 12567-12575. (c) Joo, J.; Kwon, S. G.; Yu, T.; Cho, M.; Lee, J.; Yoon, J.; Hyeon, T. J. Phys. Chem. B 2005, 109, 15297-15302.
11. (a) Yin, Y.; Alivisatos, A. P. Nature 2005, 437, 664-670. (b) Xiong, Y.; Xie, Y.; Li, Z.; Li, X.; Ciao, S. Chem. Eur. J. 2004, 10, 654-660. (c) Yang, Q.; Tang, K.; Li, Q.; Yin, H.; Wang, C.; Qian, Y. Nanotechnology 2004, 15, 918-922. (d) Fanfair, D. D.; Korgel, B. A. Cryst. Growth Des. 2005, 5, 1971-1976. (e) Davidson, F. M.; Wiacek, R.; Korgel, B. A.

Chem. Mater. 2004, 17, 230-233. (f) Liu, Z.; Sun, K.; Jian, W.-B.; Xu, D.; Lin, Y.-F.; Fang, J. Chem. Eur, J. 2009, 15, 4546-4552.

12. (a) Trentler, T. J.; Hickman, K. M.; Goel., S. C.; Viano, A. M.; Gibbons, P. C.; Buhro, W. E. Science 1995, 270, 1791-1794. (b) Wang, F.; Dong, A.; Sun, J.; Tang, R.; Yu, H.; Buhro, W. E. Inorg. Chem. 2006, 45, 7511-7521.

13. Ellis, W. C.; Frosch, C. J.; Zetterstroni, R. B. J. Cryst. Growth 1968, 2, 61-68.

It is to be understood that the above description and examples are intended to be illustrative and not restrictive. Many embodiments will be apparent to those of ordinary skill in the art upon reading the above description and examples. The embodiments disclosed herein should, therefore, be determined not with reference to the above description and examples, but should instead be determined with reference to the appended claims, along with the full scope of equivalents to which such claims are entitled. The disclosures of all articles and references, including patent applications and publications, are incorporated herein by reference for all purposes.

What is claimed is:

1. An apparatus comprising:
a photoanode configured to perform water oxidation, the photoanode including a high surface area network of photoanode nanowires; and
a photocathode configured to perform water reduction or carbon dioxide reduction, the photocathode being disposed on a surface of and being in electrical contact with the photoanode, the photocathode including a high surface area network of photocathode nanowires;
wherein (a) the photoanode nanowires are oriented in random directions with respect to the lateral dimension of the photoanode, or (b) the photocathode nanowires are oriented in random directions with respect to the lateral dimension of the photocathode.

2. The apparatus of claim 1, further comprising:
an ion conductive polymer infiltrating the photoanode and the photocathode proximate a region where the photocathode is disposed on the surface of the photoanode.

3. The apparatus of claim 1, wherein the photoanode nanowires include a photoanode material selected from the group consisting of $WO_3$, $TiO_2$, $SrTiO_3$, $NaTaO_3$, oxynitrides, TaON, GaZnON, $Fe_2O_3$, and $BiVO_4$.

4. The apparatus of claim 1, wherein a diameter of each of the photoanode nanowires is about 10 nm to 500 nm.

5. The apparatus of claim 4, wherein an aspect ratio of each of the photoanode nanowires is about 10 to 1000.

6. The apparatus of claim 1, wherein an orientation of the photoanode nanowires is selected from the group consisting of the photoanode nanowires being oriented substantially vertically with respect to a lateral dimension of the photoanode, the photoanode nanowires being oriented substantially horizontally with respect to the lateral dimension of the photoanode, and the photoanode nanowires being oriented in random directions with respect to the lateral dimension of the photoanode.

7. The apparatus of claim 1, wherein a thickness of the photoanode is less than the optical absorption length of the photoanode material.

8. The apparatus of claim 1, wherein the photocathode nanowires include a photocathode material selected from the group consisting of GaP, Si, InGaP, InP, $Cu_2O$, and Rh—Sr-$TiO_3$.

9. The apparatus of claim 1, wherein a diameter each of the photocathode nanowires is about 10 nm to 500 nm.

10. The apparatus of claim 9, wherein an aspect ratio of each of the photocathode nanowires is about 10 to 1000.

11. The apparatus of claim 1, wherein an orientation of the photocathode nanowires is selected from the group consisting of the photocathode nanowires being oriented substantially vertically with respect to a lateral dimension of the photocathode, the photocathode nanowires being oriented substantially horizontally with respect to the lateral dimension of the photocathode, and the photocathode nanowires are oriented in random directions with respect to the lateral dimension of the photocathode.

12. The apparatus of claim 1, wherein a thickness of the photocathode is less than the optical absorption length of the photocathode material.

13. The apparatus of claim 1, wherein the photoanode includes photoanode co-catalyst particles deposited on the photoanode nanowires.

14. The apparatus of claim 1, wherein the photocathode includes photocathode co-catalyst particles deposited on the photocathode nanowires.

15. The apparatus of claim 14, wherein a photocathode co-catalyst particle comprises Pt, $Mo_3S_4$, $MoS_2$, a water reduction catalyst, a $CO_2$ reduction catalyst, $MoS_3$, or Cu.

16. The apparatus of claim 15, wherein the photocathode co-catalyst particle comprises Pt or Cu.

17. The apparatus of claim 1, wherein the photoanode co-catalyst particle comprises Pt, cobalt oxide, manganese oxide, $RuO_x$, $IrO_x$, or a water oxidation catalyst.

18. The apparatus of claim 17, wherein the photoanode co-catalyst particle comprises Pt, $RuO_x$, or $IrO_x$.

* * * * *